US009733576B2

United States Patent
Smith et al.

(10) Patent No.: US 9,733,576 B2
(45) Date of Patent: Aug. 15, 2017

(54) MODEL FOR ACCURATE PHOTORESIST PROFILE PREDICTION

(71) Applicant: KLA-Tencor Corporation, Milpitas, CA (US)

(72) Inventors: Mark Davis Smith, Austin, TX (US); John Biafore, Glocester, RI (US)

(73) Assignee: KLA-Tencor Corporation, Milpitas, CA (US)

(*) Notice: Subject to any disclaimer, the term of this patent is extended or adjusted under 35 U.S.C. 154(b) by 731 days.

(21) Appl. No.: 14/220,446

(22) Filed: Mar. 20, 2014

(65) Prior Publication Data

US 2015/0261896 A1    Sep. 17, 2015

Related U.S. Application Data

(60) Provisional application No. 61/954,592, filed on Mar. 17, 2014.

(51) Int. Cl.
*G06F 17/10* (2006.01)
*G03F 7/20* (2006.01)

(52) U.S. Cl.
CPC .................. *G03F 7/705* (2013.01)

(58) Field of Classification Search
USPC .............................................. 703/2
See application file for complete search history.

(56) References Cited

U.S. PATENT DOCUMENTS

| 5,747,667 A | 5/1998 | Sadar |
| 6,174,728 B1 | 1/2001 | Ben-David et al. |
| 2003/0044703 A1 | 3/2003 | Yamada |
| 2009/0128810 A1 | 5/2009 | Bates |
| 2010/0135568 A1 | 6/2010 | Preil et al. |
| 2011/0188732 A1 | 8/2011 | Stroessner |
| 2011/0239167 A1 | 9/2011 | Rathsack |
| 2012/0064459 A1 | 3/2012 | Maeda et al. |
| 2014/0067346 A1 | 3/2014 | Biafore et al. |

FOREIGN PATENT DOCUMENTS

EP        2466379        6/2012

OTHER PUBLICATIONS

Mack (Line-Edge Roughness and the Ultimate Limits of Lithography); Proc. of SPIE vol. 7639, 763931; 2010; pp. 1-16.*
Mack 2007: Line Edge Roughness, part 3; Tutor 58, The Lithography Expert (Aug. 2007); 2007; pp. 1-4.*
(Continued)

*Primary Examiner* — Hugh Jones
(74) *Attorney, Agent, or Firm* — Meyertons, Hood, Kivlin, Kowert & Goetzel, P.C.

(57) ABSTRACT

A photoresist modelling system includes a mathematical model for a photolithography process. The mathematical model may be executable using a computer processor. The mathematical model may be used to model a photoresist as formed on a semiconductor wafer surface. A blocked polymer concentration gradient equation may be implemented into the mathematical model. The blocked polymer concentration gradient equation may describe an initial concentration gradient of a blocked polymer in the photoresist being modelled by the mathematical model.

20 Claims, 4 Drawing Sheets

(56) References Cited

OTHER PUBLICATIONS

Biafore 2012: Application of Stochastic Modeling to Resist Optimization Problems; Advances in Resist Materials and Processing Technology XXIX, edited by Somervell, Wallow, Proc. of SPIE vol. 8325,83250H; SPIE; 2012; pp. 1-13.*
International Search Report in International application No. PCT/US2015/020810, mailed Jun. 25, 2015, 3 pages.
"Standards for the Optical Detection of Protein Particles", Dean C. Ripple, et al., Jul. 18, 2011, pp. 1-14.
International Search Report and Written Opinion from PCT/US2014/046096, issued Oct. 20, 2014, KLA-Tencor Corporation, pp. 1-12.
"Prediction of the Spatial Resolution of Magnetic Particle Imaging Using the Modulation Transfer Function of the Imaging Process", Tobias Knopp, et al., IEEE Transactions on Medical Imaging, vol. 30, No. 6 Jun. 2011, pp. 1284-1292.
"New Materials for Surface Energy of 193 nm Photoresists", D. Sanders et al., 2006, pp. 1-23.
"Inertial Microfluidics", Dino DiCarlos, Lab on a Chip, Royal Society of Chemistry, Sep. 22, 2009, 3038-3046.

\* cited by examiner

MODEL FOR ACCURATE PHOTORESIST PROFILE PREDICTION

PRIORITY CLAIM

This patent claims priority to U.S. Provisional Patent Application No. 61/954,592 filed Mar. 17, 2014, which is incorporated by reference in its entirety.

BACKGROUND

1. Field of the Invention

The present invention relates to photoresist used during semiconductor processing. More particularly, the invention relates to methods for predicting photoresist profiles on semiconductor surfaces.

2. Description of Related Art

Predicting and accurately describing photoresist cross-sectional shapes after deposition of photoresist on semiconductor surfaces is an important metric for photoresist quality. Thin sections of photoresist may cause a short or break during subsequent semiconductor processing and lead to failure or decreased performance of a semiconductor device produced by the semiconductor processing. For example, during an etch process, a minimum thickness of photoresist is needed to properly transfer the photoresist pattern into the underlying surface (e.g., the semiconductor substrate).

Figure 1:
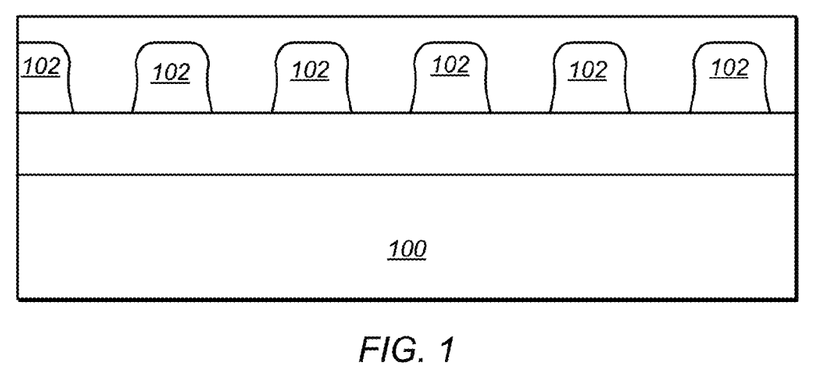
FIG. 1 depicts a cross-sectional representation of an example of a photoresist profile found using current surface inhibition/enhancement models.

Surface inhibition/enhancement models have been used to attempt to predict the behavior of photoresists and height loss during photoresist development with some measurable success. Current surface inhibition/enhancement models typically predict photoresist cross-sections with rounded top corners and a relatively flat top surface. FIG. 1 depicts a cross-sectional representation of an example of a photoresist profile found using current surface inhibition/enhancement models. Photoresist 102 is modelled as being formed on semiconductor wafer 100. As shown in FIG. 1, photoresist 102 has a cross-sectional profile with rounded top corners and relatively flat top surfaces. However, experimental cross-sectional data commonly shows photoresist profiles with completely rounded tops (e.g., dome-shaped profiles).

Additional modelling elements have been added to surface inhibition/enhancement models to attempt to more accurately predict the rounded top profile of photoresist. For example, acid contamination during PEB (post-exposure bake) has been added to produce relatively good cross-sectional shapes for photoresist profiles. Adding acid contamination includes adding acid to the top of the photoresist surface that was not created by the exposure process. This method, however, models a mechanism that is only likely when a top coat is used and rounded top profiles have been observed in photoresist systems that do not have top coats (e.g., immersion ArF photoresist systems). Thus, acid contamination during PEB is an unlikely mechanism for top loss in the photoresist. Additionally, top resist thickness loss is often relatively uniform across a variety of features and acid contamination does not predict uniform top loss.

Other photoresist models have included inhomogenous concentrations of other components of the photoresist (e.g., photoacid generator (PAG) or quencher components) to change the shape of the photoresist cross-section. For example, the concentration of the PAG or quencher component may have a gradient through the photoresist. Such models using PAG or quencher component inhomogenous concentrations, however, do not show resist loss in dark (unexposed) areas while resist loss has been observed experimentally in dark areas. Thus, there is a need for photoresist models that more accurately predict and simulate mechanisms that contribute to top loss during photoresist development (processing).

SUMMARY

In certain embodiments, a photoresist modelling system includes a mathematical model for a photolithography process. The mathematical model may be executable using a computer processor. A blocked polymer concentration gradient equation may be implemented into the mathematical model. The blocked polymer concentration gradient equation may describe a concentration gradient of a blocked polymer in a photoresist being modelled by the mathematical model. The mathematical model may be used to model a photoresist as formed on a semiconductor wafer surface.

In certain embodiments, a method for modelling a photoresist cross-sectional profile includes modelling a photoresist profile for a photoresist being formed on a semiconductor wafer surface using a mathematical model for a photolithography process executed using a computer processor. The mathematical model may include a blocked polymer concentration gradient equation. The blocked polymer concentration gradient equation may describe a concentration gradient of a blocked polymer in the photoresist being modelled by the mathematical model.

In certain embodiments, a computer readable storage medium includes program instructions executable by a processor to form a photoresist profile for a photoresist on a semiconductor wafer surface using a mathematical model for a photolithography process stored in the program instructions. The mathematical model may include a blocked polymer concentration gradient equation. The blocked polymer concentration gradient equation may describe a concentration gradient of a blocked polymer in the photoresist being modelled by the mathematical model.

In some embodiments, the blocked polymer concentration gradient equation describes an initial concentration gradient of the blocked polymer in the photoresist. In some embodiments, the blocked polymer concentration is adjusted to a selected value of a bulk concentration of the blocked polymer at an interface of the photoresist. In some embodiments, the blocked polymer concentration gradient equation describes the concentration gradient of a blocked polymer in the photoresist as an exponential function. In some embodiments, the mathematical model includes a surface inhibition/enhancement model.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

Chemically amplified photoresists are commonly used in semiconductor processing to define patterns on semiconductor wafers after photoresist exposure and subsequent processing. Chemically amplified photoresists may include a "blocking group" when the photoresist is deposited (e.g., dispensed) on a semiconductor wafer. A "blocking group" is a chemical group (e.g., a polymer group) in the photoresist that renders the photoresist insoluble to developer solution.

Semiconductor wafers coated with the chemically amplified photoresist are exposed to light on a scanner or stepper and the light from the exposure causes a photochemical reaction that generates acid in the resist. During subsequent semiconductor processing (e.g., post-exposure bake (PEB)), this acid reacts with the blocking groups (e.g., blocked polymer groups) and converts the insoluble blocking group sites into chemical groups that are soluble in developer solution. Typical photoresist models have modelled the concentration of the blocking groups as homogenous in the initial photoresist film (e.g., the "as-deposited" photoresist film). Modelling the photoresist with homogenous blocking groups (e.g., homogenous blocked polymer concentration) may produce cross-sectional shapes in the developed photoresist that are determined largely by the intensity of light in the photoresist and result in rounded top corners and relatively flat top surfaces (as shown in FIG. 1).

Figure 2:
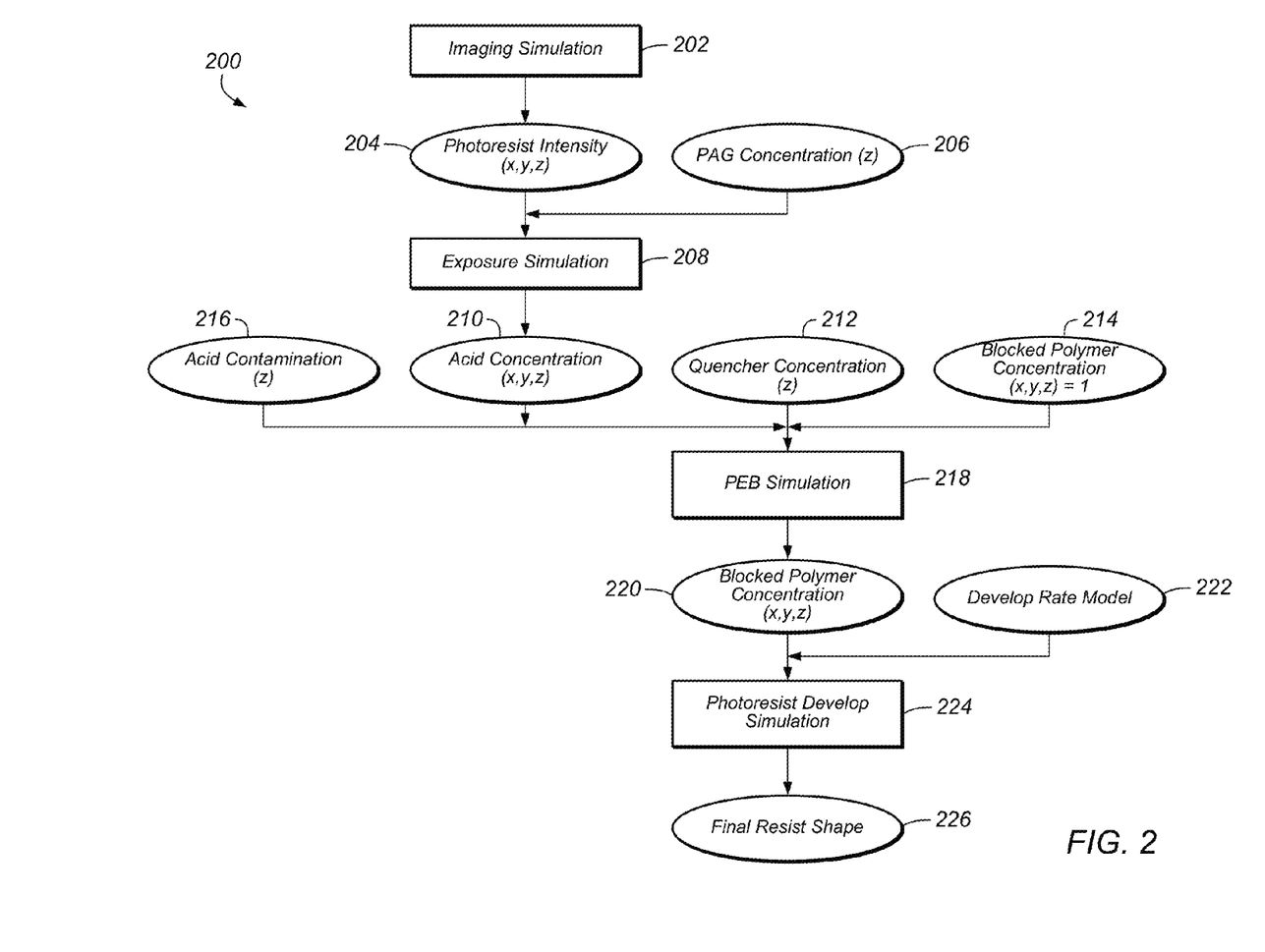
FIG. 2 depicts a flowchart of an embodiment of a typical process for modelling photoresist cross-sectional profiles.

FIG. 2 depicts a flowchart of an embodiment of a typical process for modelling photoresist cross-sectional profiles (e.g., photoresist cross-sectional shapes). Process 200 may be, for example, a mathematical model (e.g., a surface inhibition/enhancement model) for a photolithography process. Note that in FIG. 2, rectangles represent photolithography processes that are simulated and ovals represent results of a calculation or simulation. In certain embodiments, process 200 begins with imaging simulation 202 (note that not all inputs are shown for the imaging simulation) Imaging simulation 202 may output photoresist intensity 204.

In certain embodiments, photoresist intensity 204 is input into exposure simulation 208 along with photoacid generator (PAG) concentration 206. PAG concentration 206 may be a function of distance from the photoresist surfaces (represented by the z-direction). PAG concentration 206 as a function of distance from the photoresist surfaces is known as a method to control photoresist cross-sectional shape. In certain embodiments, the output of exposure simulation 208 is acid concentration 210. Acid concentration 210 may vary throughout the photoresist film in any direction (e.g., as a function of x-, y-, and z-directions).

Acid concentration 210 along with quencher concentration 212 and blocked polymer concentration 214 may be input into post-exposure bake (PEB) simulation 218. In some embodiments, acid contamination 216 may be input into PEB simulation 218. Acid contamination 216 may be a function of distance from the photoresist surfaces (z-direction). Acid contamination 216 as a function of distance from the photoresist surfaces is known as a method to control photoresist cross-sectional shape. Quencher concentration 212 may be a function of distance from the photoresist surfaces (z-direction). Quencher concentration 212 as a function of distance from the photoresist surfaces is known as a method to control photoresist cross-sectional shape.

In certain embodiments, blocked polymer concentration 214 is assumed to be constant (e.g., homogenous) throughout the photoresist film. The output of PEB simulation 218 is blocked polymer concentration 220, which is a function of x-, y-, and z-directions. Blocked polymer concentration 220 may be input into photoresist develop simulation 224 along with develop rate model 222. In certain embodiments, develop rate model 222 includes a surface function that depends on the distance from the photoresist surfaces (z-direction). Develop rate enhancement or inhibition near photoresist surfaces is a known as a method to control photoresist cross-sectional shape.

In certain embodiments, the result of photoresist develop simulation 224 is final resist shape 226. FIG. 1 depicts an example of final resist shape 226 found using process 200 (e.g., final resist shape 226 is represented by photoresist 102 on semiconductor wafer 100). Thus, process 200, shown in FIG. 2, may produce a photoresist cross-sectional profile with rounded top corners and relatively flat top surfaces, such as shown in FIG. 1, because of the assumption of homogenous blocked polymer concentration 214.

The polymer used in photoresist, however, is typically a blend of two or more different polymers. For example, the photoresist may include polymers with both high and low molecular weights. Because the dissolution rate depends on the molecular weight of the polymer, there can be differences (e.g., gradients) in polymer concentration throughout the photoresist before and after photoresist development. In some embodiments, the photoresist includes different blocking levels of polymers. The different blocking levels may be used for quality control on different batches of raw materials. In some embodiments, the photoresist includes one or more embedded barrier layers. For example, the photoresist may include a topcoatless polymer for immersion. In some embodiments, the photoresist includes a mixture of "regular" polymers (e.g., typical photoresist polymers) and polymers that contain PAG (photoacid generator) functional groups.

The blending of different polymers in the photoresist may lead to a vertical gradient in a blocking level for the photoresist. The vertical gradient in the blocking level may be caused by one or more blocking groups in the photoresist having a concentration gradient that varies vertically. For example, topcoatless photoresists may use hydrophobic additives that phase separate to the photoresist surface.

European Patent No. 2466379 to Hasegawa et al., U.S. Patent Appl. Publ. No. 2012/0064459 to Maeda et al., and "New materials for surface energy of 193 nm photoresists" by D. Sanders et al. (presented at the 4th International Symposium on Immersion Lithography), each of which is incorporated by reference as if fully set forth herein, describe examples of hydrophobic additives that phase separate to the photoresist surface. Photoresists with the hydrophobic additives typically have loadings of 1% to 5% of additives. Some additives may be developable-switchable (e.g., contain acidic groups soluble in TMAH (tetramethylammonium hydroxide) while some additives may be photoswitchable (e.g., contain blocked groups that become soluble in TMAH after reaction with photoacid during PEB). In certain embodiments, the additives have a lower "dose-to-clear" than the photoresist to avoid t-topping (e.g., the formation of large insoluble heads in the feature).

Because of the vertical gradient in blocking level found in the chemically amplified photoresists, modelling of the photoresist using a concentration of blocking groups (e.g., blocked polymer concentration) that is not homogenous may provide more accurate prediction of the cross-sectional profiles of the photoresist after processing of the photoresist. In certain embodiments, the blocked polymer concentration provided to a photoresist model is lower or higher near the photoresist interfaces in the initial (as-deposited) photoresist film (e.g., the initial blocked polymer concentration is depleted or enhanced near the top or bottom surfaces of the photoresist film). In some embodiments, the initial blocked polymer concentration is lower near the top surface of the photoresist film and higher near the bottom surface of the photoresist film.

The initial blocked polymer concentration provided to the photoresist model (e.g., a surface inhibition/enhancement model) may, however, be varied as desired to provide a more accurate prediction of the cross-sectional profile of the photoresist after development and subsequent processing. For example, the initial blocked polymer concentration provided to the photoresist model may be varied to more accurately represent a cross-sectional profile of photoresist found during experimental observation (e.g., through SEM (scanning electron microscopy), TEM (transmission electron microscopy), or other cross-sectional examination techniques).

In certain embodiments, the initial blocked polymer concentration is adjusted (e.g., reduced or increased) to a selected value at the top surface (e.g., the air/resist interface) or the bottom surface (e.g., the wafer/resist interface) of the photoresist film. The selected value of the initial blocked polymer concentration may have a gradient (e.g., slowly change or decay) to the nominal (bulk) concentration as concentration moves into the photoresist film. In some embodiments, the blocked polymer concentration gradient has an increased blocked polymer concentration near a surface of the photoresist film and the blocked polymer concentration reduces as concentration moves into the photoresist film. In some embodiments, the blocked polymer concentration gradient has a reduced blocked polymer concentration near a surface of the photoresist film and the blocked polymer concentration increases as concentration moves into the photoresist film.

The change in concentration moving into the film (e.g., the gradient in concentration) may be described by an exponential function. The selected value of the initial blocked polymer concentration at the top surface may be, for example, between about 20 percent and about 40 percent below the bulk concentration of the blocked polymer. The range for the selected value may, however, vary depending on factors such as, but not limited to, polymer distribution and polymer composition. For example, the selected value may be between about 10 percent and about 50 percent below the bulk concentration of the blocked polymer, between about 25 percent and about 35 percent below the bulk concentration of the blocked polymer, or between about 20 percent and about 30 percent below the bulk concentration of the blocked polymer.

In some embodiments, the blocked polymer concentration is described by exponential decay in an equation such as EQN. 1:

$$M = (R-1)e^{-z/\delta} + 1; \tag{1}$$

where M is the blocked polymer concentration, R is the fraction of concentration reduction, $\delta$ is the depth of the reduction, and z is the distance from the interface.

Using an equation describing exponential decay of the initial blocked polymer concentration, such as EQN. 1 above, in a photoresist model may provide a more accurate prediction of the cross-sectional shape (profile) of the photoresist after development and subsequent processing (e.g., the resulting cross-sectional shape of the photoresist that defines a pattern on the semiconductor wafer). Thus, providing an equation describing the initial blocked polymer concentration gradient into a surface inhibition/enhancement model provides better modeling control over the cross-sectional shape of the photoresist and provides more realistic photoresist profile shapes (e.g., profile shapes that better resemble experimentally observed profile shapes such as dome-shaped profiles).

In some embodiments, other functions are used to describe the gradient in blocked polymer concentration. For example, a hyperbolic tangent function may be used to describe the gradient in blocked polymer concentration. EQN. 2 may describe the blocked polymer concentration gradient in terms of hyperbolic tangent function. EQN. 2 is as follows:

$$M = (R-1)\tan h(-z/\delta) + R. \tag{2}$$

In certain embodiments, the equation describing the initial blocked polymer concentration gradient is programmed into software executable by a processor (e.g., a computer processor). In some embodiments, the equation describing the initial blocked polymer concentration gradient is stored as program instructions in a computer readable storage medium (e.g., a non-transitory computer readable storage medium) and the equation is executable by a processor. In certain embodiments, the equation describing the initial blocked polymer concentration gradient is implemented as part of a mathematical model (e.g., a surface inhibition/enhancement model) for a photolithography process. The equation describing the initial blocked polymer concentration gradient may be implemented in computer code as part of the mathematical model. For example, the equation may be implemented in computer code as part of the photolithography model PROLITH. The mathematical model for the photolithography process may be stored as program instructions in a computer readable storage medium (e.g., a non-transitory computer readable storage medium) and executable by a processor (e.g., a computer). In some embodiments, the mathematical model for the photolithography process is programmed into software executable by the processor.

Figure 3:
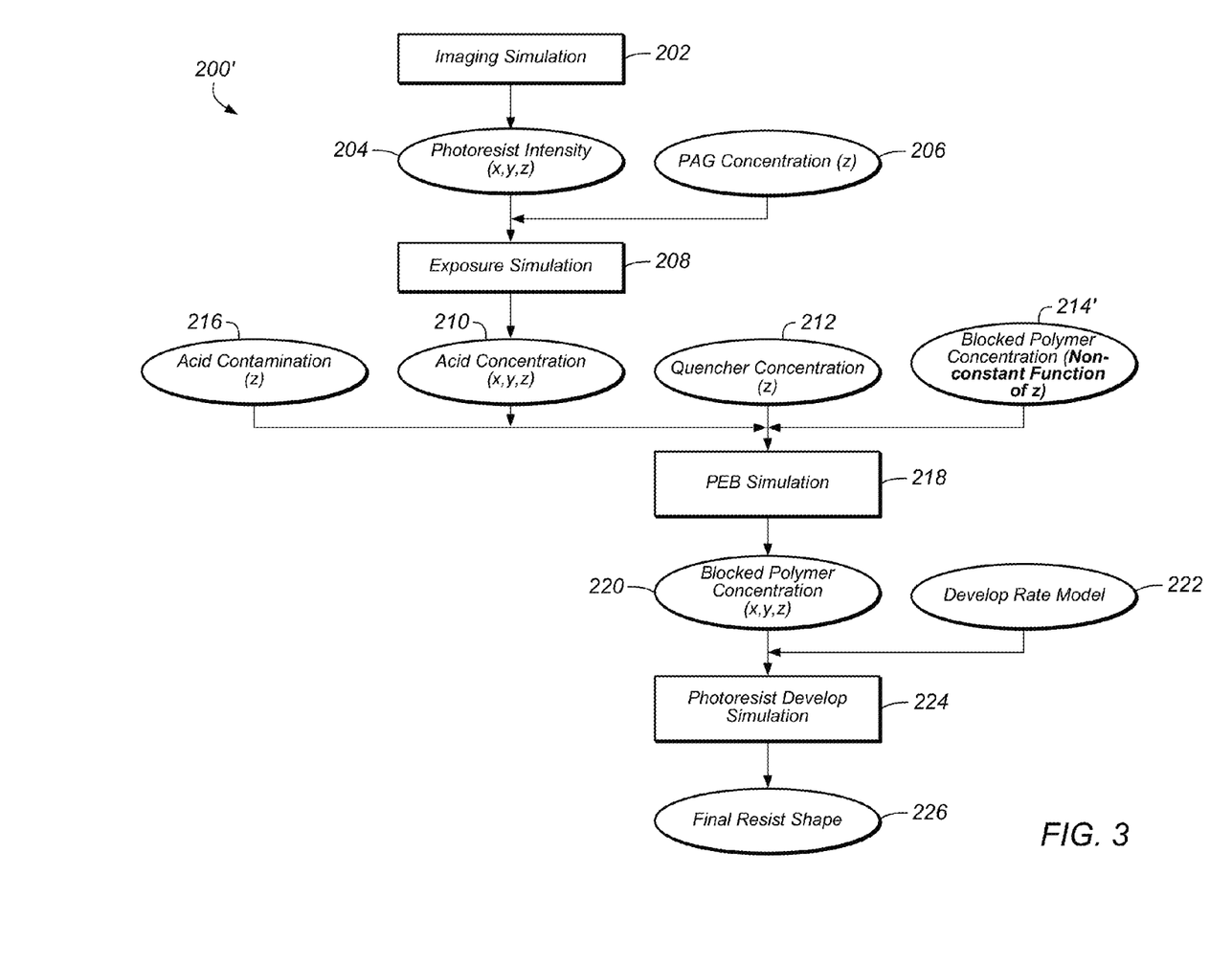
FIG. 3 depicts a flowchart of an embodiment of a process for modelling photoresist cross-sectional profiles with an equation describing an initial blocked polymer concentration gradient.

FIG. 3 depicts a flowchart of an embodiment of a process for modelling photoresist cross-sectional profiles (e.g., photoresist cross-sectional shapes) with an equation describing an initial blocked polymer concentration gradient. Process 200' may be, for example, a mathematical model (e.g., a surface inhibition/enhancement model) for a photolithography process. Process 200' is substantially similar to process 200, shown in FIG. 2, except that blocked polymer concentration 214' is input into PEB simulation 218 instead of blocked polymer concentration 214.

In certain embodiments, blocked polymer concentration 214' is provided as a function of distance from the photoresist surfaces (e.g., z-direction). For example, an equation describing an initial blocked polymer concentration gradient (such as EQNS. 1 or 2 shown above) may be used to describe blocked polymer concentration 214' as a function of distance from the photoresist surfaces. Providing blocked polymer concentration 214' as a function of distance from the photoresist surfaces may produce more accurate photoresist cross-sectional profiles than found using homogenous blocked polymer concentrations (such as found in process 200, shown in FIG. 2).

Figure 4:
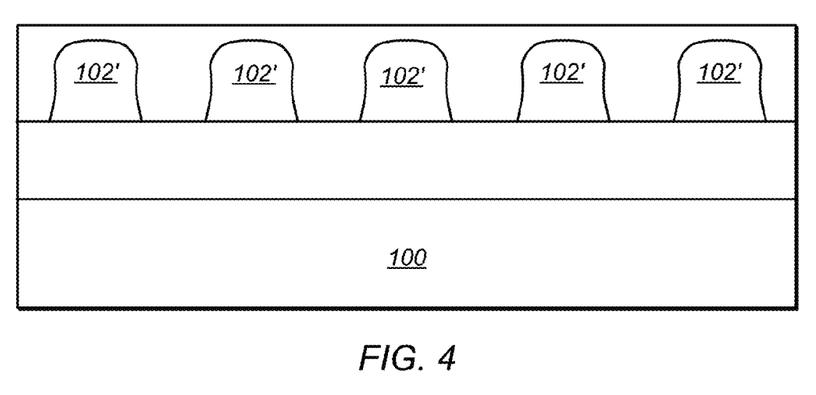
FIG. 4 depicts a cross-sectional representation of a photoresist profile found using a surface inhibition/enhancement model provided with the equation describing the initial blocked polymer concentration gradient.
Figure 5:
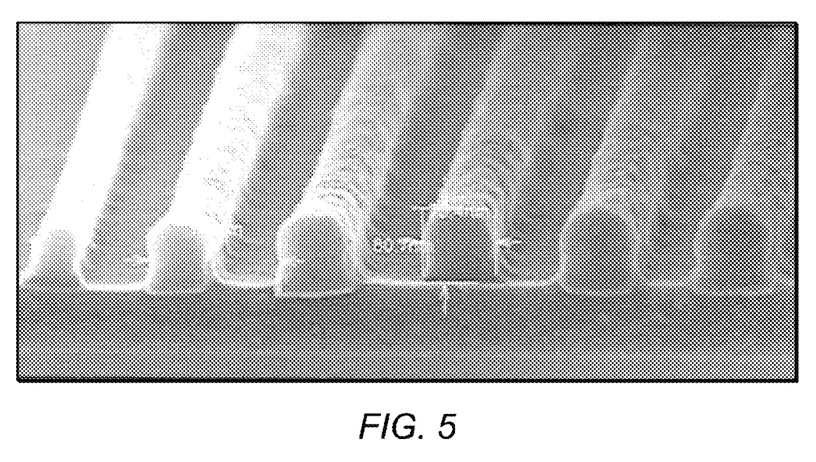
FIG. 5 depicts an example of an SEM image of photoresist profiles found through experimental observation.

FIG. 4 depicts a cross-sectional representation of a photoresist profile found using a surface inhibition/enhancement model provided with the equation describing the initial blocked polymer concentration gradient (such as process 200' shown in FIG. 3). In certain embodiments, photoresist 102' is modelled as formed on semiconductor wafer 100 using the surface inhibition/enhancement model provided with an equation describing the initial blocked polymer concentration gradient. As shown in FIG. 4, photoresist 102' may have a more rounded cross-sectional profile (e.g., dome-shaped profiles). Photoresist 102' has a cross-sectional profile that is relatively representative of the photoresist profiles found through experimental observation. FIG. 5 depicts an example of an SEM image of photoresist profiles found through experimental observation.

Figure 6:
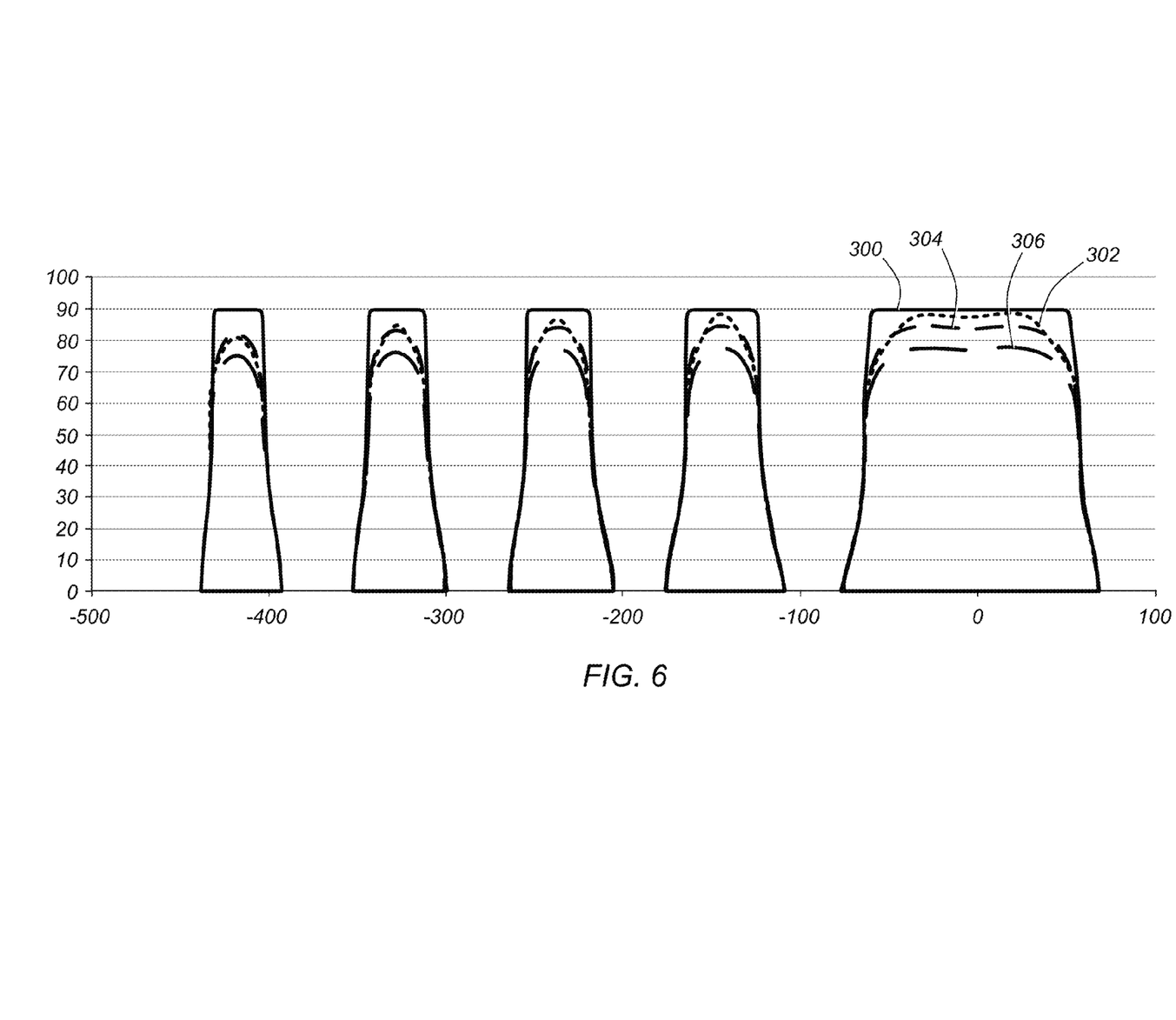
FIG. 6 depicts a comparison of cross-sectional representations of photoresist profiles found using different parameters in a surface inhibition/enhancement model.

FIG. 6 depicts a comparison of cross-sectional representations of photoresist profiles found using different parameters in a surface inhibition/enhancement model. Photoresist profile 300 is formed using a model with no gradients in the blocked polymer concentration (e.g., the blocked polymer has a homogenous concentration). Photoresist profile 302 is formed using a model with no gradients in the blocked polymer concentration with the addition of a PEB acid contamination spike. Photoresist profile 304 is formed using a model that incorporates EQN. 1 to describe the initial blocked polymer concentration gradient with δ, the depth of the reduction, being 10 nm and R, the fraction of concentration reduction, being 0.7. Photoresist profile 306 is formed using a model that incorporates EQN. 1 to describe the initial blocked polymer concentration gradient with δ, the depth of the reduction, being 10 nm and R, the fraction of concentration reduction, being 0.4. As shown in FIG. 6, more accurate (rounded) profile shapes for the photoresist are found using the models incorporating EQN. 1 to describe the initial blocked polymer concentration gradient. In addition, the top loss shown in the photoresist profiles is more uniform using the models incorporating EQN. 1 to describe the initial blocked polymer concentration gradient than the model using the PEB acid contamination spike.

More accurate prediction of the profile shapes of the photoresist may be useful in scatterometry models and for computer-aided improvement of photolithography materials and processes or simulation. For example, calculation of an accurate photoresist profile (e.g., 3D model of the photoresist) may be useful in applications such as, but not limited to, lithography process optimization, OPC verification (failure modes due to thin photoresist), and accurate shapes for model-based metrology (such as scatterometry).

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a shape" includes a combination of two or more shapes and reference to "a polymer" includes mixtures of polymers.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A photoresist modelling system, comprising:
   a computer comprising a processor;
   a memory coupled to the processor and storing one or more program instructions executable by the processor to:
   provide one or more process parameters for a photolithography process to a mathematical model stored in the program instructions, the photolithography process being used to form a photoresist on a semiconductor wafer surface, wherein the photoresist comprises at least one blocked polymer, and wherein at least one of the process parameters comprises a blocked polymer concentration in the photoresist;
   implement the mathematical model for the photolithography process, wherein the mathematical model is used to model the photoresist formed on the semiconductor wafer surface using the photolithography process, wherein a blocked polymer concentration gradient equation is implemented into the mathematical model, and wherein the blocked polymer concentration gradient equation describes a concentration gradient of a blocked polymer in the photoresist being modelled by the mathematical model, the blocked polymer concentration gradient equation describing the concentration gradient of the blocked polymer as a function of distance from an interface of the photoresist and the semiconductor wafer surface, a fraction of concentration reduction, and a depth of the reduction; and
   assess the modelled photoresist profile of the photoresist being formed on the semiconductor wafer surface; and
   control a photoresist profile of the photoresist as it is being formed on the semiconductor wafer surface by adjusting one or more process parameters of the photolithography process based on the assessment of the modelled photoresist profile.

2. The system of claim 1, wherein the blocked polymer concentration gradient equation describes an initial concentration gradient of the blocked polymer in the photoresist.

3. The system of claim 1, wherein the blocked polymer concentration is adjusted to a selected value of a bulk concentration of the blocked polymer at an interface of the photoresist.

4. The system of claim 3, wherein the selected value is between about 20 percent and about 40 percent below the bulk concentration of the blocked polymer.

5. The system of claim 1, wherein the blocked polymer concentration gradient equation describes an increased blocked polymer concentration near a surface of the photoresist, and wherein the blocked polymer concentration decreases as concentration moves into the photoresist.

6. The system of claim 1, wherein the blocked polymer concentration gradient equation describes the concentration gradient of a blocked polymer in the photoresist as an exponential function.

7. The system of claim 1, wherein the blocked polymer concentration gradient equation comprises the equation:

$$M=(R-1)e^{-z/\sigma}+1;$$

wherein M is the blocked polymer concentration, R is the fraction of concentration reduction, σ the depth of the reduction, and z is the distance from the interface.

8. A method for modelling a photoresist cross-sectional profile, comprising:
   providing one or more process parameters for a photolithography process to a mathematical model executed using a computer processor, the photolithography process being used to form a photoresist on a semiconductor wafer surface, wherein the photoresist comprises at least one blocked polymer, and wherein at least one of the process parameters comprises a blocked polymer concentration in the photoresist;
   modelling, using the computer processor, a photoresist profile of the photoresist being formed on the semiconductor wafer surface using the mathematical model, wherein the mathematical model includes a blocked polymer concentration gradient equation, and wherein the blocked polymer concentration gradient equation describes a concentration gradient of a blocked polymer in the photoresist being modelled by the mathematical model, the blocked polymer concentration gradient equation describing the concentration gradient of the blocked polymer as a function of distance from an interface of the photoresist and the semiconductor wafer surface, a fraction of concentration reduction, and a depth of the reduction;
   assessing, using a computer processor, the modelled photoresist profile of the photoresist being formed on the semiconductor wafer surface; and
   controlling a photoresist profile of the photoresist as it is being formed on the semiconductor wafer surface by adjusting, using a computer processor, one or more process parameters of the photolithography process based on the assessment of the modelled photoresist profile.

9. The method of claim 8, wherein the blocked polymer concentration gradient equation describes an initial concentration gradient of the blocked polymer in the photoresist.

10. The method of claim 8, further comprising adjusting the blocked polymer concentration to a selected value of a bulk concentration of the blocked polymer at an interface of the photoresist.

11. The method of claim 10, wherein the selected value is between about 20 percent and about 40 percent below the bulk concentration of the blocked polymer.

12. The method of claim 8, wherein the blocked polymer concentration gradient equation describes the concentration gradient of a blocked polymer in the photoresist as an exponential function.

13. The method of claim 8, wherein the blocked polymer concentration gradient equation comprises the equation:

$$M=(R-1)e^{-z/\sigma}+1;$$

wherein M is the blocked polymer concentration, R is the fraction of concentration reduction, σ is the depth of the reduction, and z is the distance from the interface.

14. A non-transitory computer readable storage medium including program instructions executable by a processor to:
   provide one or more process parameters for a photolithography process to a mathematical model, the photolithography process being used to form a photoresist on a semiconductor wafer surface, wherein the photoresist comprises at least one blocked polymer, and wherein at least one of the process parameters comprises a blocked polymer concentration in the photoresist;
   form a photoresist profile for the photoresist on the semiconductor wafer surface using the mathematical model for the photolithography process stored in the program instructions, wherein the mathematical model includes a blocked polymer concentration gradient equation, and wherein the blocked polymer concentration gradient equation describes a concentration gradient of a blocked polymer in the photoresist being modelled by the mathematical model, the blocked polymer concentration gradient equation describing the concentration gradient of the blocked polymer as a function of distance from an interface of the photoresist and the semiconductor wafer surface, a fraction of concentration reduction, and a depth of the reduction;
   assessing the photoresist profile of the photoresist formed on the semiconductor wafer surface by the mathematical model; and
   controlling a photoresist profile of the photoresist as it is being formed on the semiconductor wafer surface by adjusting one or more process parameters of the photolithography process based on the assessment of the photoresist profile formed on the semiconductor wafer surface by the mathematical model.

15. The computer readable storage medium of claim 14, wherein the blocked polymer concentration gradient equation describes an initial concentration gradient of the blocked polymer in the photoresist.

16. The computer readable storage medium of claim 14, further comprising adjusting the blocked polymer concentration to a selected value of a bulk concentration of the blocked polymer at an interface of the photoresist.

17. The computer readable storage medium of claim 16, wherein the selected value is between about 20 percent and about 40 percent below the bulk concentration of the blocked polymer.

18. The computer readable storage medium of claim 14, wherein the blocked polymer concentration gradient equation describes the concentration gradient of a blocked polymer in the photoresist as an exponential function.

19. The method of claim 8, wherein at least one of the adjusted process parameters is the blocked polymer concentration in the photoresist.

20. The method of claim 8, further comprising:
   comparing the modelled photoresist profile of the photoresist being formed on the semiconductor wafer surface to an image of a photoresist profile for a photoresist formed by the photolithography process;
   adjusting at least one parameter of the blocked polymer concentration gradient equation, the at least one parameter being one of the distance from the interface of the photoresist and the semiconductor wafer surface, the fraction of concentration reduction, and the depth of the reduction;

modelling, using the computer processor, a second photoresist profile of the photoresist being formed on the semiconductor wafer surface using the mathematical model with at least one parameter of the blocked polymer concentration gradient equation being adjusted;

comparing the second photoresist profile of the photoresist to the image of the photoresist profile for the photoresist formed by the photolithography process; and repeating said adjustment and said modelling until said second photoresist profile has a desired accuracy compared to the image of the photoresist profile for the photoresist formed by the photolithography process.

* * * * *